(12) United States Patent
Alapati et al.

(10) Patent No.: US 7,737,031 B2
(45) Date of Patent: Jun. 15, 2010

(54) INSITU FORMATION OF INVERSE FLOATING GATE POLY STRUCTURES

(75) Inventors: Ramakanth Alapati, Boise, ID (US); Gurtej Sandhu, Boise, ID (US)

(73) Assignee: Intel Corporation, Santa Clara, CA (US)

( * ) Notice: Subject to any disclaimer, the term of this patent is extended or adjusted under 35 U.S.C. 154(b) by 369 days.

(21) Appl. No.: 11/832,972

(22) Filed: Aug. 2, 2007

(65) Prior Publication Data

US 2009/0035905 A1 Feb. 5, 2009

(51) Int. Cl.
  *H01L 21/44* (2006.01)
  *H01L 21/4763* (2006.01)
  *H01L 21/336* (2006.01)

(52) U.S. Cl. .................. 438/657; 438/257; 438/593; 438/594

(58) Field of Classification Search ............. 438/257, 438/264, 593, 594, 657; 257/E21.422, E29.129, 257/E29.3, 314–315
See application file for complete search history.

(56) References Cited

U.S. PATENT DOCUMENTS

| 5,298,436 | A * | 3/1994 | Radosevich et al. | 438/396 |
| 7,033,957 | B1 * | 4/2006 | Shiraiwa et al. | 438/770 |
| 2006/0252193 | A1 * | 11/2006 | Rabkin et al. | 438/197 |
| 2007/0122973 | A1 * | 5/2007 | Lee | 438/257 |

FOREIGN PATENT DOCUMENTS

KR  2001-0065186  * 7/2001

OTHER PUBLICATIONS

Sandhu, Gurtej, et al; Semiconductor Constructions, And Methods Of Forming Semiconductor Constructions And Flash Memory Cells; USPTO U.S. Appl. No. 11/512,781, filed Aug. 29, 2006.

* cited by examiner

*Primary Examiner*—Ha Tran T Nguyen
*Assistant Examiner*—Karen M Kusumakar
(74) *Attorney, Agent, or Firm*—Cool Patent, P.C.; Joseph P. Curtin

(57) ABSTRACT

Briefly, in accordance with one or more embodiments, a method of making an inverse-t shaped floating gate in a non-volatile memory cell or the like is disclosed.

8 Claims, 4 Drawing Sheets

INSITU FORMATION OF INVERSE FLOATING GATE POLY STRUCTURES

BACKGROUND

In the integrated circuit (IC) manufacturing industry, there is a universal drive to shrink the geometries of IC substrate areas. At the same time, manufacturers strive to reduce power consumption, increase storage capacity and to increase reliability of IC devices. With respect to memory devices, in order to accomplish these competing goals, manufacturers must grapple with how to efficiently produce memory storage devices that operate reliably at lower voltages.

DETAILED DESCRIPTION

In the following detailed description, numerous specific details are set forth in order to provide a thorough understanding of claimed subject matter. However, it will be understood by those skilled in the art that claimed subject matter may be practiced without these specific details. In other instances, well-known methods, procedures, and components have not been described in detail so as not to obscure claimed subject matter.

Although, the embodiments described herein refer to non-volatile memory devices, such as, for example, flash, electrically programmable read-only memory (EPROM), electrically erasable programmable read-only memory (EEPROM), and so on. Such embodiments are meant for illustrative purposes and are not intended to limit the scope of the disclosure. The disclosed method and apparatus may find applications in other integrated circuits, such as dynamic random access memory (DRAM) and static random access memory (SRAM) for example.

Figure 1:
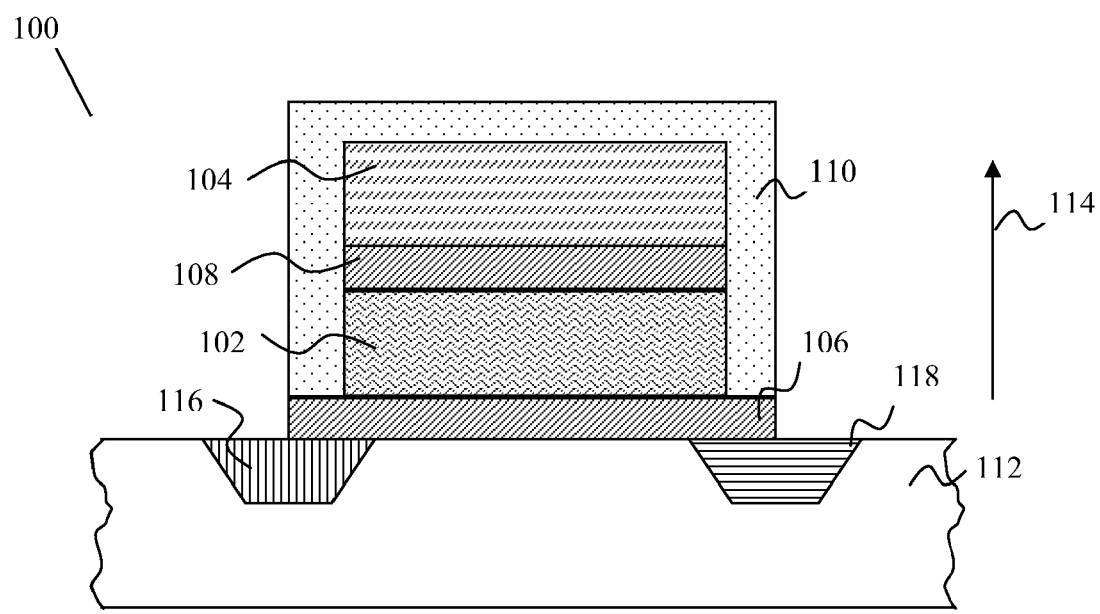
FIG. 1 is a cross-sectional view of a particular conventional embodiment of a memory cell.

FIG. 1 is a cross-sectional view of a conventional embodiment of memory cell 100. According to a particular embodiment, floating gate 102 and control gate 104 may be stacked and positioned above tunnel oxide 106. In a particular embodiment, floating gate 102 and control gate 104 may be separated by dielectric layer 108. Dielectric 108 may be an oxide, an oxide-nitride-oxide (ONO) layer or a high K dielectric, such as, hafnium oxide or aluminum oxide. Dielectric 108 may enable isolation of floating gate 102 from other electrodes such as; control gate 104, substrate 112, source 116 and drain 118. Additionally, dielectric layer 110 may surround floating gate 102 and control gate 104 and may comprise silicon dioxide ($SiO_2$). Dielectric layer 110 may provide a protective layer for floating gate 102 and control gate 104.

In a particular embodiment, floating gate 102 may be programmed by injecting electrons from substrate 112, to floating gate 102. Increasing capacitive coupling between control gate 104 and floating gate 102 may enable reliable operation at reduced voltage because improving capacitive coupling results in increasing the fraction of voltage applied to control gate 104 that is coupled to floating gate 102. In a particular embodiment, capacitive coupling may be improved by increasing the amount of surface area overlap between floating gate 102 and control gate 104. In this disclosure, such overlapping surface area may be referred to as a "coupling area." Accordingly in particular embodiments, the coupling area may be increased by a variety of methods, such as, for instance, increasing the thickness of floating gate 102 and/or altering the shape of floating gate 102. However, these are merely examples of methods of increasing the coupling area between a floating gate and control gate in a memory device and claimed subject matter is not so limited.

In a particular embodiment, it may be desirable to decrease crosstalk between adjacent floating gates and to increase capacitive coupling without increasing the footprint of the memory device. To that end, the coupling area between floating gate 102 and control gate 104 may be increased by increasing the surface area of floating gate 102 in the vertical direction 114 with respect to the plane of substrate 112. Increasing the surface area of floating gate 102 in the vertical direction 114 may improve capacitive coupling without increasing the footprint of the device. Additionally, with a thinner floating gate 102, separation between adjacent floating gates (not shown) increases, which may decrease crosstalk between floating gates. However, increasing the coupling area in the vertical direction requires numerous processing steps which in conventional practice decreases manufacturing throughput and increases costs.

Figure 2:
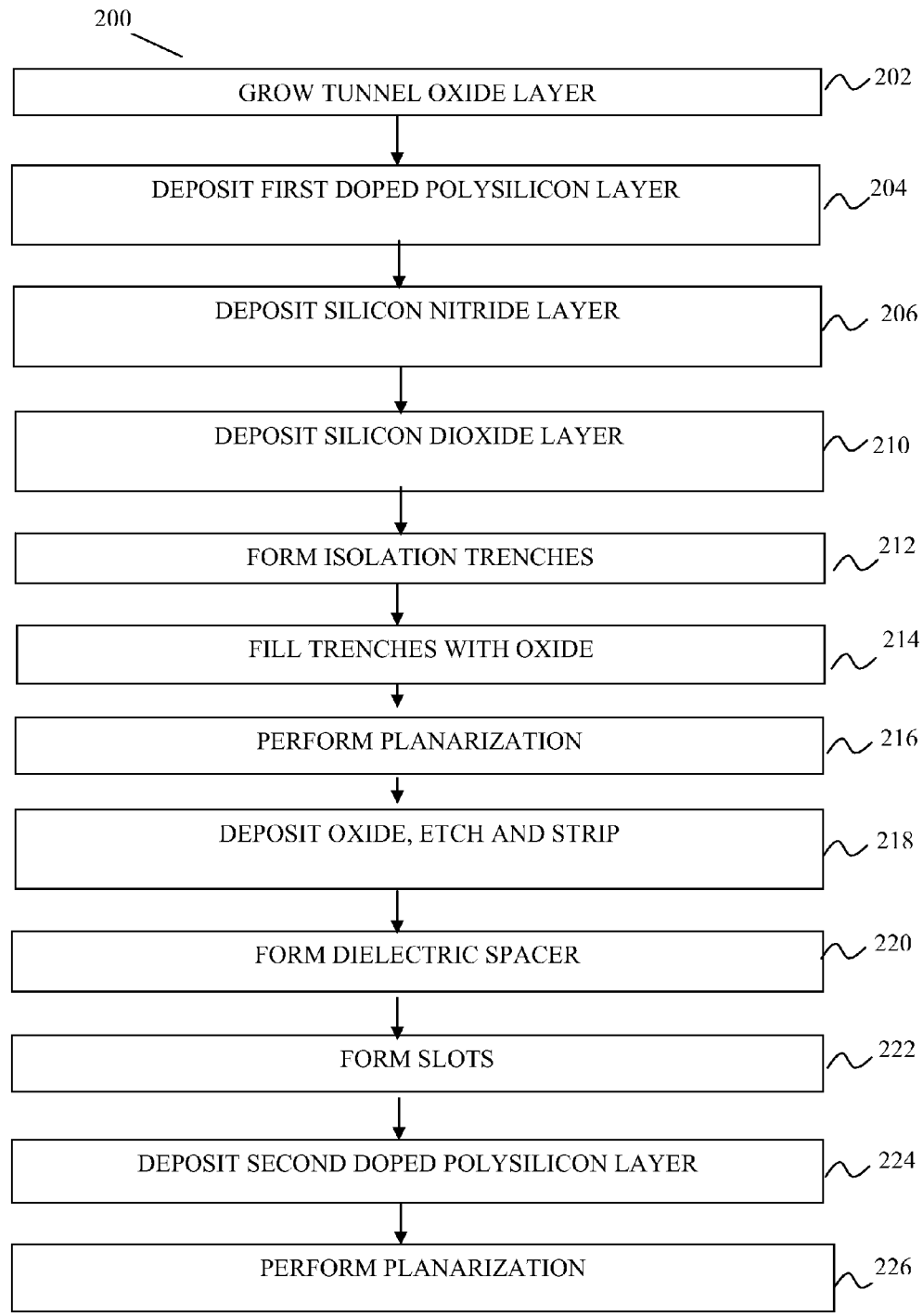
FIG. 2 is a block diagram illustrating a particular embodiment of a conventional process for making a memory cell.

FIG. 2 is a flow diagram of a conventional process 200 for forming an "inverse-t" feature such as a floating gate in a non-volatile memory cell. According to a particular embodiment, process 200 may comprise many processing steps. In a particular embodiment, starting at block 202, a first tunnel oxide layer may be grown over a substrate surface. At block 204, a doped polysilicon layer may be deposited over a tunnel oxide layer. Then, at block 206, a silicon nitride layer may be deposited over the doped polysilicon layer. At block 210, a layer of silicon dioxide may be deposited on the silicon nitride layer. At block 212, the device may be etched and stripped multiple times in order to form isolation trenches. At block 214, the trenches may be filled with oxide. At block 216, the device may be planarized. At block 218, a layer of oxide may be deposited over the planarized surface and then etched and stripped. At block 220, dielectric spacers may be formed along edges of the strips formed at block 220. At block 222, the nitride layer may be etched to form slots. At block 224, a second layer of doped polysilicon may be deposited over the device, and into the slots coupling to the first polysilicon strip. At block 226, the device may be planarized leaving vertical projections of the second polysilicon strip, thus forming an "inverse-t" feature. At block 228, the remaining nitride strip segments may be removed.

Figure 3:
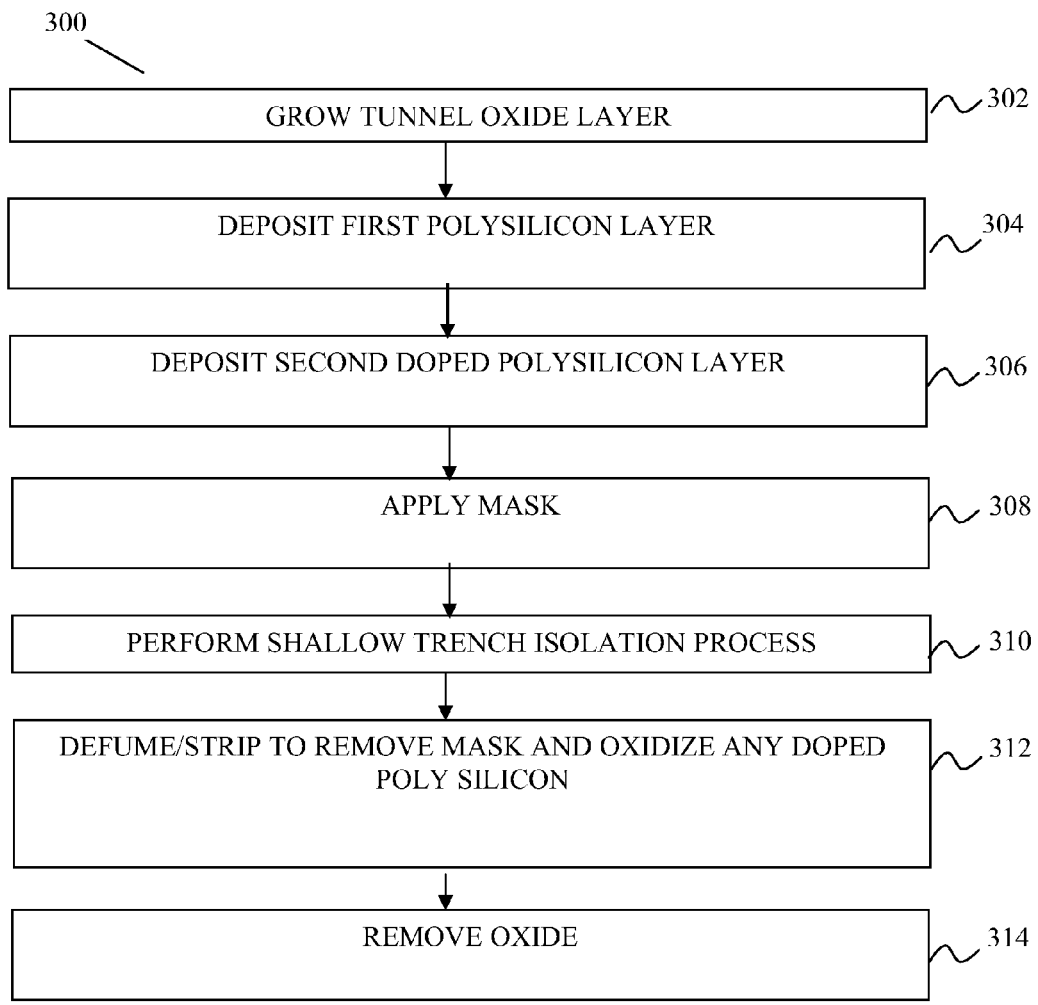
FIG. 3 is a block diagram illustrating a particular embodiment of a process for making a memory cell.

FIG. 3 is a flow diagram of process 300 for forming an "inverse-t" feature such as a floating gate in a non-volatile memory cell having an increased coupling area. According to a particular embodiment, process 300 may enable elimination of a number of conventional processing steps.

According to a particular embodiment, starting at block 302, a first tunnel oxide layer may be grown over a substrate surface. In a particular embodiment, the tunnel oxide may be any higher quality tunnel oxide, such as nitrided tunnel oxide, for example. According to a particular embodiment, the tunnel oxide may be grown to a depth of about 60.0-70.0 Å, for example.

At block 304, a first polysilicon layer may be deposited over the tunnel oxide layer. The first polysilicon layer may be undoped or lightly doped. According to a particular embodiment, the first polysilicon layer, if doped, may be n-doped or p-doped. Then, at block 306, a second layer polysilicon may be deposited over the first polysilicon layer. In a particular embodiment, the second polysilicon layer may be n-doped or p-doped. In a particular embodiment, the second layer of polysilicon may be more heavily doped than the first polysilicon layer.

At block 308, a mask may be applied. In a particular embodiment, the mask may comprise a variety of materials, such as resist, carbon or a combination of resist and carbon.

At block 310, trenches may be formed through the layers of polysilicon, tunnel oxide and substrate by shallow trench isolation (STI). In a particular embodiment, the trenches may have a variety of depths, such as, for instance, about 1500.0-2200.0 Å. In a particular embodiment, a variety of chemistries may be employed to perform STI, such as, for instance hydrogen bromide (HBr) or chlorine ($Cl_2$). Additionally, in a particular embodiment, STI may be performed at a pressure of about 15.0-20.0 mT.

At block 312, a defume/strip step may be performed to remove the mask applied at block 308 as well as degas any bromine (Br) or chlorine (Cl) based polymer residuals. In a particular embodiment, the defume/strip step may be carried out in an enclosure in oxygen (O2) plasma at low pressures, for example, (e.g., 5 to 20 mTorr), high source power (e.g., 500 W to 1000 W) and very low bias voltage (e.g., 20V to 100V bias volatage). However, these are merely examples of physical parameters in which a defume/strip step may be carried out and claimed subject matter is not so limited.

According to a particular embodiment, a controlled defume/strip step may enable mask removal as well as promote oxidation of any doped polysilicon layer. In a particular embodiment, the extent of oxidation of the second layer of doped polysilicon layer may vary from about 50.0 to 100.0 Å on the top and lateral sidewalls of the STI structure. In a particular embodiment, an oxide may not form on the first polysilicon layer due to a difference in oxidizing properties of the first and second layers of polysilicon.

At block 314, the layer of oxide formed over the second polysilicon layer may be removed by a variety of processes such as a wet clean in dilute hydrofluoric acid (HF) for a short duration. Any other solvent that etches oxide may also be used. In a particular embodiment, such removal may result in formation of an "inverse-t" feature. According to a particular embodiment, the feature may be a floating gate of a memory cell. However, this is merely an example of a feature that may be formed by the process and method described herein and claimed subject matter is not so limited. In a particular embodiment, processing may continue and may provide additional features of a non-volatile memory cell.

Figure 4A:
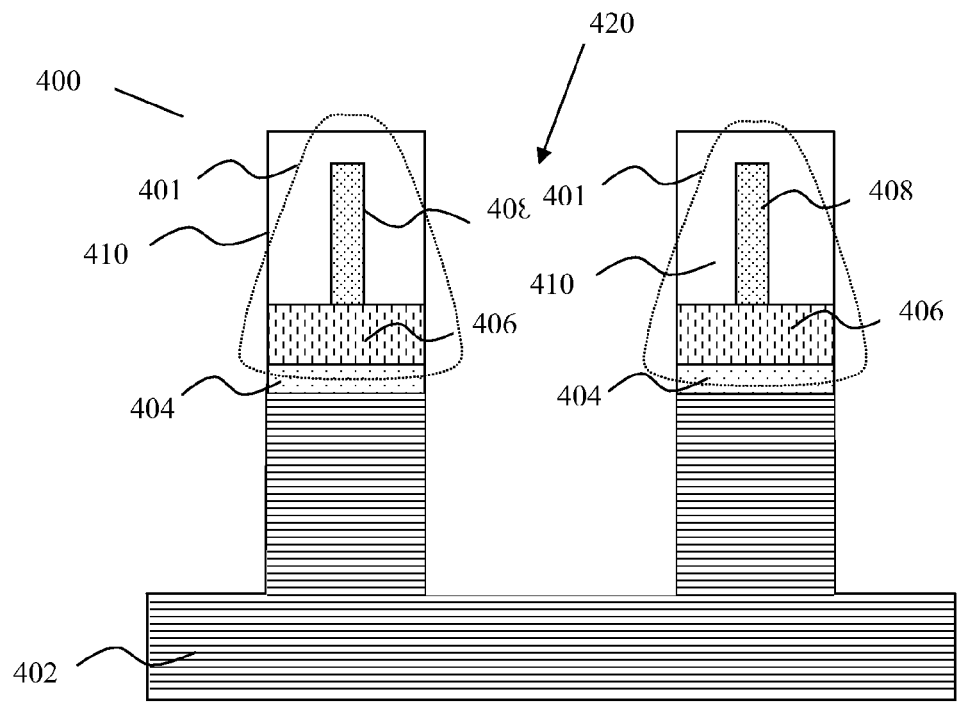
FIG. 4A is a cross-sectional view of a particular embodiment of a memory cell.

FIG. 4A is a cross-sectional view of a particular embodiment of an inverse-t shaped floating gate 401 of memory cell 400 produced by the process and method described in FIG. 3. According to a particular embodiment, trench 420 may be formed through the layers of substrate 402, tunnel oxide 404, first polysilicon layer 406 and second polysilicon layer 408 by shallow trench isolation step 310. After the defume/strip step 312 an oxide 410 may be formed on second polysilicon layer 408. In a particular embodiment, an oxide may not form on first polysilicon layer 406 due differences in oxidation properties of the polysilicon layers. However, this is merely an example of a method of forming a feature in a doped polysilicon and claimed subject matter is not so limited. Accordingly, a feature formed in a polysilicon by oxidation may have a variety of other shapes.

Figure 4B:
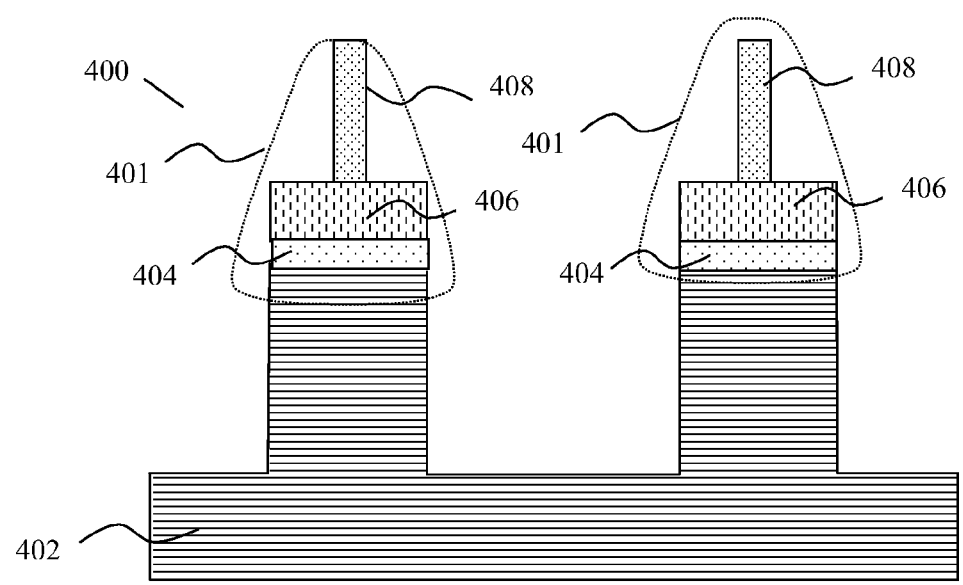
FIG. 4B is a cross-sectional view of a particular embodiment of a memory cell.

FIG. 4B is a cross-sectional view of a particular embodiment of an inverse-t shaped floating gate 401 of memory cell 400 produced by the method described in FIG. 3. According to a particular embodiment, after oxide 410 is formed on second polysilicon layer 408, the oxide may be removed by a variety of processes, as described above in FIG. 3. In a particular embodiment, after oxide 410 is removed, floating gate 401 clearly takes on an inverse-t shape. Processing of memory cell 400 may continue and may include formation of a control gate (not shown) and other features of memory cell 400.

While certain features of claimed subject matter have been illustrated as described herein, many modifications, substitutions, changes and equivalents will now occur to those skilled in the art. It is, therefore, to be understood that the appended claims are intended to cover all such embodiments and changes as fall within the true spirit of claimed subject matter.

What is claimed is:

1. A method of making an inverse-t shaped floating gate in a non-volatile memory cell, comprising:
   forming a tunnel oxide layer on a substrate;
   depositing a first polysilicon layer over the layer of tunnel oxide, the first polysilicon layer comprising: undoped, p-doped or n-doped or combinations thereof;
   depositing a second polysilicon layer over the first polysilicon layer, the second polysilicon layer comprising: p-doped or n-doped or combinations thereof, and the second polysilicon layer being more heavily doped than the first polysilicon layer;
   applying a mask over the second polysilicon layer;
   forming a trench at least partially extending through the first and second polysilicon layers and the tunnel oxide and the trench at least partially extending into the substrate;
   stripping the mask from the second polysilicon layer and forming an oxide layer on a top surface and sidewalls of the second polysilicon layer during a controlled defume/strip process carried out in oxygen plasma; and
   removing the oxide from the top surface and sidewalls of the second polysilicon layer.

2. The method of claim 1, wherein removing the oxide from the top surface and sidewalls of the second polysilicon layer forms the inverse-t shaped floating gate.

3. The method of claim 2, wherein the tunnel oxide layer has a depth of about 60-70 Å.

4. The method of claim 2, wherein said forming a trench results in the trench having a depth of about 1500-2200 Å.

5. The method of claim 2, wherein the trench is formed by shallow trench isolation performed at about 15-20 mTorr of pressure.

6. The method of claim 2, wherein the mask is stripped and the oxide is formed at about 5 mTorr-20_mTorr.

7. The method of claim 2, wherein the mask is stripped and the oxide is formed at about 5000_W-1000 W.

8. The method of claim 2, wherein the mask is stripped and the oxide is formed at about 20_V-100_V.

* * * * *